310-337 SR

8/19/86 XR 4,607,185

United States Patent [19]

Elbert et al.

[11] Patent Number: 4,607,185

[45] Date of Patent: Aug. 19, 1986

[54] ULTRASONIC HORN ASSEMBLY

[75] Inventors: Lawrence E. Elbert, Huntington Beach; Charles S. Irwin, Santa Ana, both of Calif.

[73] Assignee: American Hospital Supply Corporation, Evanston, Ill.

[21] Appl. No.: 697,277

[22] Filed: Feb. 1, 1985

[51] Int. Cl.⁴ .............................................. H01L 41/08

[52] U.S. Cl. .................................... 310/323; 310/326; 310/337

[58] Field of Search ........................ 310/323, 337, 326; 74/155; 228/1.1; 156/580.2; 239/102

[56] References Cited

U.S. PATENT DOCUMENTS

| | | | |
|---|---|---|---|
| 3,140,859 | 7/1964 | Scarpa | 310/323 X |
| 3,696,259 | 10/1972 | Mori et al. | 310/323 |
| 4,363,992 | 12/1982 | Holze, Jr. | 310/323 |
| 4,483,571 | 11/1984 | Mishiro | 310/323 |

*Primary Examiner*—Patrick R. Salce
*Assistant Examiner*—Emanuel Todd Voeltz
*Attorney, Agent, or Firm*—Perman & Green

[57] ABSTRACT

An ultrasonic horn assembly, particularly suitable for dissolving reagent tablets in a liquid solution in a cuvette which is moved along a path next to the front end face of the horn, includes a generally cylindrical converter fixed to a rear end face of the horn body substantially medial of the length of the rear end face. A pair of elongate resonating members are each fixed at one end to a different side end region of the rear end face on the horn body, and extend perpendicularly from the rear end face. The resonating members cause acoustic waves to propagate from the front end face of the horn body at substantially uniform amplitude along the length of the front end face, so that objects such as cuvettes moving parallel to the front end face are continuously subjected to uniform acoustic waves to insure a thorough dissolving or mixing operation.

16 Claims, 3 Drawing Figures

ULTRASONIC HORN ASSEMBLY

BACKGROUND OF THE INVENTION

1. Field of the Invention

The present invention relates generally to ultrasonic horn assemblies, and particularly to such an assembly which may be at least partially immersed in a liquid bath through which cuvettes containing a liquid solution and a reagent tablet are moved in front of the horn so that transmitted acoustic waves cause the tablet to dissolve in the liquid solution in each of the cuvettes.

2. Description of the Known Art

Ultrasonic horn assemblies are known to be used in clinical analyzers, for purposes of dissolving reagent tablets in liquid solutions contained in a number of cuvettes moving along a track path next to the front of the horn assembly. One such clinical analyzer is disclosed in U.S. patent application Ser. No. 575,924, filed Feb. 1, 1984, and assigned to the assignee of the present invention, the contents of which are incorporated in their entirety by reference in the present application.

The known ultrasonic horn assemblies comprise a generally rectangular horn body with a front end face for transmitting acoustic waves, and a rear end face on which a pair of piezoelectric crystal transducers, or converters, are symetrically mounted. The rear end face on the horn body of the known assembly is of a height of about 1.5 inches (3.81 cm), and the front end face on the horn body is of a height of about 0.25 inches (0.64 cm). The difference in height of area between the rear end face and the front end face on the known horn body thus was of a ratio of about six to one, so as to provide a gain factor of 1:6.

Further, the known horn body was made of aluminum and required a polyurethane coating of between 20 to 30 mils (0.51 to 0.76 mm) thickness across the horn body face and other portions of the body. The coating was required to protect the aluminum material of which the horn body was formed from eroding on account of cavitation during operation of the horn assembly. It was found, however, that anti-bacterial agents added to the liquid bath within which the horn assembly was immersed attacked the polyurethane coating on the horn body so as to render the coating ineffective.

Another problem encountered with the known horn assembly was a non-uniformity in the amplitude of acoustic waves transmitted from the front end face of the horn body in the direction along the length of the front end face, so that complete dissolution occured of a reagent tablet in a liquid solution contained in a moving cuvette, was not always assuredly obtained. Further, the above mentioned requirement of horn gain of 1:6 had to be obtained by making the height or area of the rear end face of the horn body six times that of the front end face resulting in a relatively unstable configuration which contributed to unevenness in the generation of acoustic waves from the front end face of the horn body.

SUMMARY OF THE INVENTION

The present invention provides an ultrasonic horn which overcomes the above and other shortcomings in the known ultrasonic horn assemblies.

The invention provides an ultrasonic horn assembly capable of transmitting acoustic waves of substantially uniform amplitude along the length of the front end face on a horn body. The invention also provides an ultrasonic horn assembly which requires no special coating to prevent erosion of a horn body on account of cavitation. In addition, the ultrasonic horn assembly provides a single converter unit, thereby obviating balanced driving requirements imposed with the use of multiple converter units.

According to one embodiment of the invention, an ultrasonic horn assembly comprises a generally rectangular horn body which transmits acoustic waves normally from a front end face on the body to interact with an object in the vicinity of the front end face, in responsive to vibrations applied to a rear end face on the horn body. Converter means is fixed to the rear end face on the horn body, at a location medial of the length of the rear end face, and applies the vibrations to the horn body in response to electrical energy. A pair of elongate resonating members are each fixed at one end to a different side end region of the rear end face on the horn body, and extend normally from the rear end face. The resonating members operate to cause the acoustic waves to propagate from the front end face at substantially uniform amplitude in the direction of the length of the front end face.

For a better understanding of the present invention, reference is made to the following description and accompanying drawings, while the scope of the present invention is pointed out in the appended claims.

DETAILED DESCRIPTION OF THE INVENTION

Figure 1:
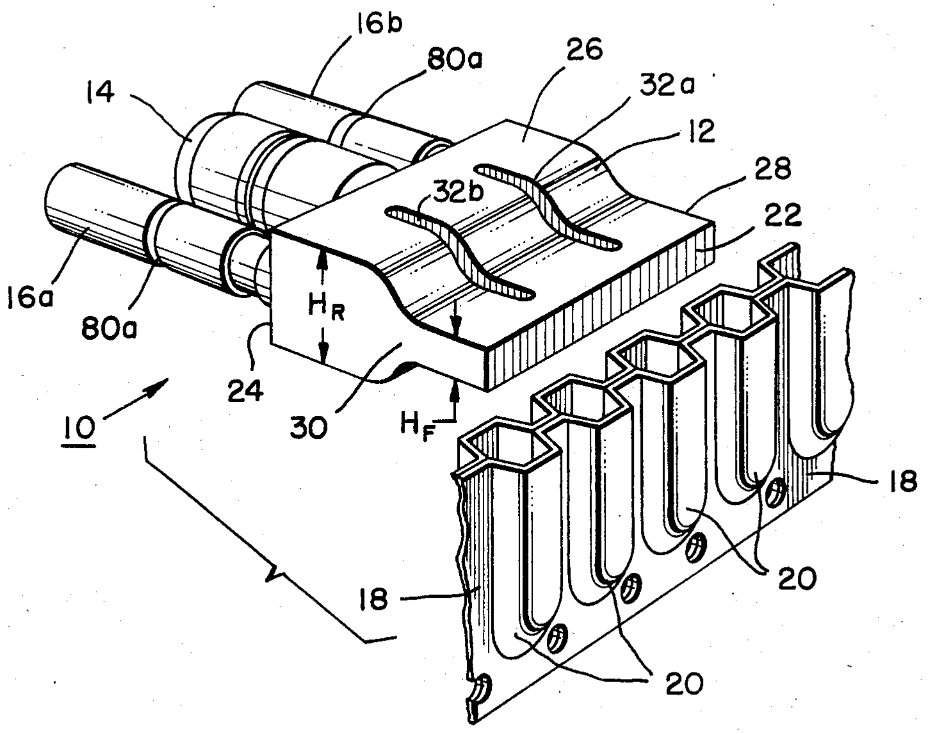
FIG. 1 is prospective view of an ultrasonic horn assembly according to the invention, showing the assembly in operative relation to a series of cuvettes being moved laterally next to the front end surface of a horn body.

FIG. 1 shows an ultrasonic assembly 10 according to the invention, the assembly 10 being comprised basically of a horn body 12, a driving or converter unit 14 and a pair of elongate resonating members ***16a*, *16b*. Members *16a*, *16b* can be made in any suitable shape such as a cylindrical shape as shown in FIG. 1. FIG. 1 also represents a typical operating environment for the horn assembly 10, where a band or belt 18 of a series of cuvettes 20 are moved laterally of the horn assembly 10 in the direction of a front end face 22 on the horn body 12**.

Figure 2:
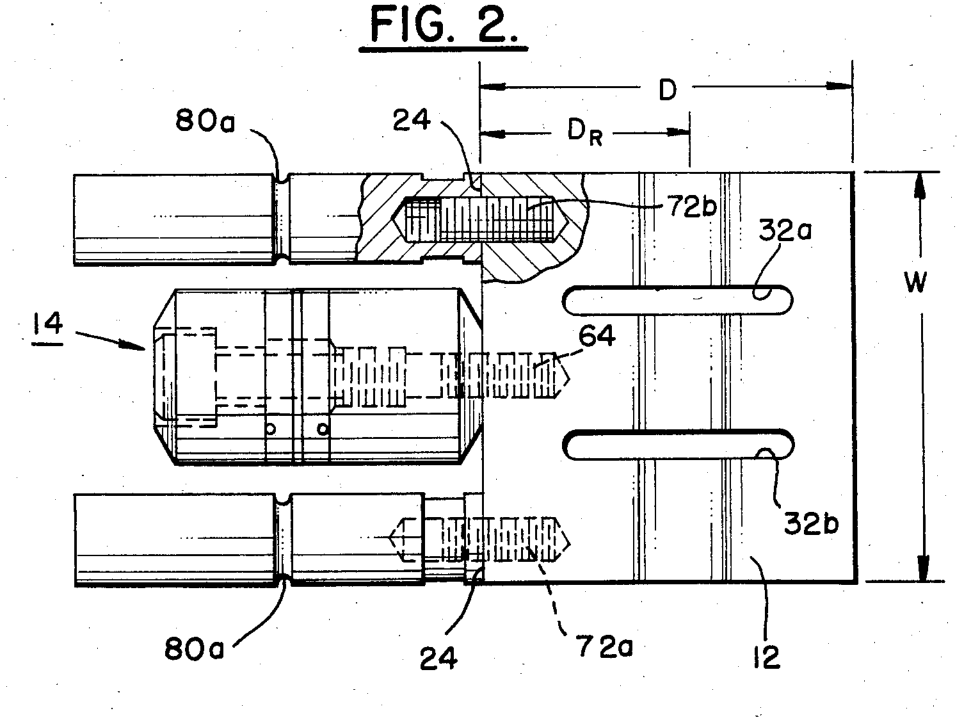
FIG. 2 is a plan view of the ultrasonic horn assembly of FIG. 1, partly in section.

As seen more clearly in FIG. 2, the converter unit 14 and the resonating members ***16a*, *16b* are each mounted at one end on a rear end face 24 of the horn body 12**.

Horn body 12 is of generally rectangular shape and can be made of any suitable material such as aluminum, stainless steel, etc. The horn body is preferably composed of titanium alloy 6Al-4V. It has been discovered that the use of the titanium alloy for the horn body 12 obviates the prior requirement of a plastic coating over the horn body for purposes of prevention of corrosion due to cavitation while the horn 10 is operating. That is, it has been found that the mentioned titanium alloy is impervious to antimicrobial agents such as Biocide in the water bath environment in which the horn 10 may be placed when used in, for example, an automated clinical analyzer. With the prior horn bodies made of aluminum, polyurethane coatings applied to the horn body to suppress cavitation effects were, themselves, attacked by the Biocide solution.

As far as is known, the use of heat treated titanium for an ultrasonic horn body, for purposes of cavitation control, is unique. It has also been discovered that at least the same anti-corrosion properties can be obtained with the use of Inconel which is preferably heat treated, although annealed Inconel is also satisfactory. Heat treated titanium was found to be as good as heat treated Inconel in terms of volume loss, that is, loss of volume of material over a period of time. The heat treated titanium was thus found to be far better than aluminum without any coating material for fabrication of the horn body 12, and heat treated titanium was found to perform much better than regular annealed titanium. Even though heat treated Inconel material may exceed heat treated titanium as far as its corrosion resistance is concerned when left uncoated, it is substantially more expensive than the titanium and is extremely difficult to machine.

Tests conducted with three horn bodies 12 made of annealed titanium have resulted in excess of 1,000 hours of useful life, and it is expected that between two to three times more life will be realized with horn bodies of heat treated titanium.

The horn body 12 disclosed in the present embodiment provides a gain factor of about 1:3. That is, the rear end face 24 is of an area or height which is about three times that of the front end face 22. Typical dimensions for the horn body 12 include an overall width W of about 3.50 inches (8.89 cm) and overall depth D of about 3.25 inches (8.26 cm), a front end face height $H_F$ of about 0.25 inches (0.64 cm), and a rear end face height $H_R$ of about 0.75 inches (1.91 cm).

As shown more clearly in FIG. 1, the horn body 12 comprises a generally rectangular rear body section 26 which has the rear end face 24 at its rear end, and a generally rectangular front body section 28 which has the front end face 22 at its front end. The rear body section 26 and the front body section 28 are integrally formed to define a thickness transition region 30 at which the thickness or height of the horn body 12 reduces from a substantially uniform height for the rear body section 26 to a substantially uniform height for the front body section 28. Preferably, the thickness transition region substantially coincides with a nodal plane when acoustic waves are transmitted from the front end face 22 of the horn body 12. In the present embodiment, the depth $D_R$ of the rear body section 26 is about 1.53 inches (3.89 cm). Also, it is preferred that the front end face 22 and the rear end face 24 of the horn body 12 each coincide with an antinodal plane when acoustic waves are transmitted by the horn body 12.

Horn body 12 also has a pair of elongate slots **32*a*, 32*b* extending through its entire thickness, each of the slots 32*a*, 32*b* being located the same distance from and extending parallel to a different side of a horn body center line which is perpendicular to the front and rear end faces respectively. The slots 32*a*, 32*b* are formed to attenuate undesired modes of vibration through the horn body 12**.

In the present embodiment, using a horn body 12 of heat-treated titanium alloy, optimum dimensions for the slots **32*a*, 32*b* were found to be 2.03 inches length (5.16 cm), 0.26 inches wide (0.66 cm), the rear ends of the slots 32*a*, 32*b* being located at about 0.67 inches (1.70 cm) from the rear end face 24**, and the longitudinal center lines of the slots each being spaced from the horn body center line by about 0.625 inches (1.59 cm).

Generally, it has been found that if the horn body 12 is wider than about 2.5 inches (6.35 cm), then vibrations may be produced in the lateral direction or a diagonal direction across the horn body. The provision of one or more slots such as the slots **32*a*, 32*b* serve to confine the propagation of the vibrations along the longitudinal direction of the horn body, i.e., a direction normal to the plane of the front end face 22 of the horn body 12**.

As mentioned, the width W of the horn body 12 in the present embodiment is about 3.50 inches. As shown in FIG. 1, in a typical application of the ultrasonic horn assembly 10 of the present invention, a series of cuvettes 20 are moved in a direction parallel to the front end face 22 of the horn body 12, at a relatively small distance from the front end face 22. When the cuvettes 20 move at a speed typically encountered in an automated analyzer, each cuvette 20 is subjected to acoustic waves transmitted from the front end face 22 for about 45 seconds assuming a horn body width W of about 3.5 inches.

Basically, the longer each cuvette 20 is subjected to the acoustic waves from front end face 22, the lower the wave intensity necessary for dissolving the reagent powder tablet deposited in a liquid solution contained in the cuvette 20. Thus, the wider the front end face 22, the more certain is the dissolution of tablets in the cuvettes 20 for a given power level. This is important since older tablets generally do not dissolve as well as fresher ones. With the present horn assembly, reagent tablets in the cuvettes 20 have been found to dissolve in about 10 seconds after passing ahead of the horn body end face 22. The 45 second exposure realized with the present horn assembly thus insures that even the most hard to dissolve tablets will, in fact, dissolve to a sufficient degree.

Further, owing to the use of the slots, **32*a*, 32*b*, and the resonating members 16*a*, 16*b* which will be described in detail below, the acoustic wave energy in the vicinity of the front end face 22 is substantially constant in the path of the moving cuvettes 20. This is important, since, if the energy were not constant, there is always the possibiity of incomplete dissolution of reagent tablets in cuvettes 20**, and misting or turbulence within the cuvette.

Figure 3:
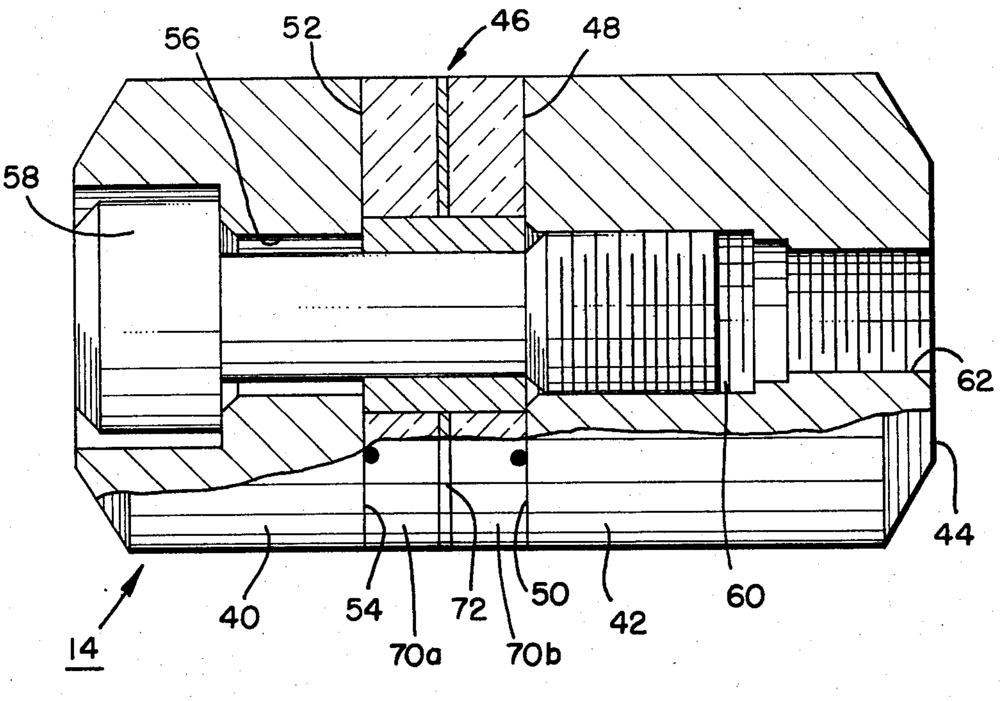
FIG. 3 is an enlarged, partly sectional view of a converter unit forming a part of the horn assembly of FIG. 1.

The structure of the converter unit 14 is shown more clearly in FIG. 3. Basically, the converter unit 14 comprises a cylindrical back section 40, a cylindrical front section 42, one axial end face 44 of which is formed to abut the rear end face 24 of the horn body 12, and a cylindrical crystal unit 46, one axial end face 48 of which abuts the opposite axial end face 50 of the front section 42, and the opposite axial end face 52 of which crystal unit abuts an axial end face 54 of the back section 40. The back section 40, front section 42 and crystal unit 46 each have an axial bore so as to form an axial opening 56 through the entire converter unit 14. A screw member 58 extends through the axial opening 56 to engage threads 60 provided in the bore in the front section 42 so that the screw member 58 clamps the back and the front sections 40, 42 against the end faces of the crystal unit 46 when the screw member 58 is tightened with the bottom of its head 62 bearing against a shoulder formed in the bore in the back section 40.

In the present embodiment, the cylindrical back section 40 is formed of stainless steel type 416. The outer diameter is set at about 1.515 inches (3.85 cm), and its height measures about 0.95 inches (2.41 cm). The rear section 40 can be machined from; e.g., stainless steel rod of 1⅝ diameter.

The front section 42, in the present embodiment, comprises aluminum alloy type 7505-T651 formed to the same diameter as the rear section 40, and measures abut 1.347 inches (3.42 cm) in height. Front section 42 also may be formed from 1⅝ inch diameter rod stock.

Another set of threads 62 are formed at the forward end of the bore in the front section 42 for engaging corresponding threads on a stud 64 extending normally from the rear end face 24 of the horn body 12 (see FIG. 2). Accordingly, the length of the screw member 58 is such that it does not interfere with the leading end of the stud 64 when the converter unit 14 is tightened onto the stud 64 with a torque of about 25 foot-pounds. In the present embodiment, the threads 62 in the front section 42, and the mating threads on the stud 64 measure ⅜–24. The screw member 58 is preferably torqued to 75 foot-pounds, the member 58 itself being a ½–20 draw bolt in the converter unit 14 of the present assembly.

The acoustic impedance of the rear section 40 is about 2.5 times that of the front section 42 when using the materials and dimensions set out above for both sections 40,42. Such characteristics allow the front section 42 which, in the present embodiment, is made of aluminum, to vibrate at a higher amplitude than the rear section 40 and thus provide a degree of built-in gain in the converter unit 14. That is, the rear end face of the rear section 40 does not vibrate appreciably but the forward end face 44 of the front section 42 vibrates at an amplitude which is about 2½ times that at the opposite end face on the rear section 40. Such built-in gain thus allows the actual gain of the horn body 12 to be reduced from the previous level of a gain of about 6 to the present gain of 3 for the horn body 12.

The crystal unit 46 comprises two axially aligned cylindrical disks 70*a*, 70*b* of piezoelectric material, and a metallic shim 72 interposed between confronting axial end faces of the disks 70*a*, 70*b* so as to allow the shim 72 to apply an electrical potential to the confronting end faces of the disks 70*a*, 70*b*. Each of the disks 70*a*, 70*b* is of diameter of about 1.5 inches (3.81 cm), and a height of about 0.25 inches (0.64). The disks may be of a material known as PZT4 obtainable from Vernitron Piezoelectric Division, Bedford, Ohio, or from Channel Industries, Santa Barbara, Calif. The disks 70*a*, 70*b* should be able to be driven by a high frequency AC source, for example, 500 to 600 volts at 30 kilohertz, and handle a power input of about 75 to 100 watts. Contact shim 72 can be made, for example, from flat beryllium copper shim stock which is formed into a large washer shape, with a connecting tab or terminal on its outside circumference. The thickness of the shim 72 may be on the order of 5 to 10 thousandths of an inch. It will thus be appreciated that an electrical potential can be applied to the axially confronting end faces of the Piezoelectric disks 70*a*, 70*b* by the shim 72 while the opposite end faces of the disk are maintained at a common potential of the metal rear and front sections 40, 42 of the converter unit 14, the screw member 58 keeping the rear section 40 at the potential of the metal horn body 12 to which the front section 42 is directly clamped by way of the stud 64. The two crystal disks 70*a*, 70*b* thus are electrically connected in parallel with one another. Further, the crystal unit 46 itself is located substantially coincident with a nodal plane when acoustic waves are transmitted by the horn body 12.

Each of the resonating members 16*a*, 16*b* is of generally cylindrical shape and can be formed of, for example, stainless steel rod type 416 with a diameter of 0.75 (1.91 cm). The resonating members are preferably of a length corrsponding to one half the operating acoustical wave length. Resonating members 16*a*, 16*b* form an important part of the present ultrasonic horn assembly 10, in that they provide for horn stability and a substantially constant acoustic wave energy level at the front end face 22 of the horn body 12, and also serve as means for mounting the entire horn assembly 10 within a housing (not shown). Moreover, the use of a material such as magnetic stainless steel for the resonating member 16*a*, 16*b* and rear converter section 40 enables vibrational movement of the rear end faces of the members to be detected by a variable reluctance magnetic pick up (not shown) to provide a feedback loop with the AC power source which draws the converter unit 14.

As seen in FIGS. 1 and 2, each of the resonating members 16*a*, 16*b* has a circumferential mounting groove 80*a*, 80*b*, respectively, in its outer periphery for seating a horn mounting member such as an O ring (not shown) when the entire ultrasonic horn assembly 10 is mounted within a water tight housing (not shown). Details of a housing for the present horn assembly 10 are omitted herein as being unnecessary to a full understanding of the present invention, and also due to the fact that different applications of the horn assembly 10 may require different structural features for a suitable housing if any is required. Nevertheless, regardless of the nature of mounting means provided for the horn assembly 10, it is preferred the mounting grooves 80*a*, 80*b*, be formed substantially coincident with a nodal plane when acoustic waves are transmitted by the horn body 12. In the present embodiment, the overall length of the resonating members 16*a*, 16*b* is about 3.4 inches (8.64 cm), and the circumferential grooves 80*a*, 80*b* are located 1.65 inches (4.19 cm) from the axial ends of the resonating members which abut the horn body 12.

Each of the resonating members 16*a*, 16*b* is fixed at one end to the horn body 12 by way of studs 72*a*, 72*b* arranged similar to the stud 64 in the horn body 12 which secured the converter unit 14. That is, each of the resonating members has a threaded axial opening through the end which confronts the horn body 12, for threadably engaging a corresponding one of the studs 72*a*, 72*b*. In the present embodiment, the centers of the studs 72*a*, 72*b* are each located about 0.375 inches (0.95 cm) in from the longitudinal edges of the horn body 12.

It has been found that the resonating members 16*a*, 16*b* serve to maintain the level of acoustic waves substantially uniform along the direction of the front end face 22 of the horn body 12, whereas in the absence of the resonating members the amplitude of acoustic waves would become substantially less at the lateral ends of the end face 22 and at the center of the end face.

Further, it would be appreciated that by the use of a single converter unit 14 in the present horn assembly 10, it is not necessary to match two or more converter units to a single body, as in the known horn assemblies. Such prior matching was difficult if not impossible to realize in production, and any resulting mismatch of multiple converter units to a single horn body would result in an imbalanced output from the front of the horn body. With only a single converter unit 14 in the present horn assembly 10, and a single associated driving circuit, production consistency is all the more insured.

Although the resonating members 16*a*, 16*b* are, in the present embodiment, made of stainless steel, all that is required is that they be made of a material which has a relatively high acoustic impedance, and be of matched lengths. Use of a magnetic stainless steel, as in the present embodiment, allows a feedback to be developed for input to the converter driving unit, as noted above.

While the foregoing description and drawing represent the preferred embodiment of the present invention, it will be obvious to those skilled in the art that various changes and modifications may be made therein without departing from the true spirit and scope of the persent invention.

We claim:

1. An ultrasonic horn assembly, comprising:

a generally rectangular horn body having a front end face and a rear end face opposite to said front end face, for transmitting acoustic waves substantially normally from said front end face to interact with an object moved in the vicinity of said front end face, in response to vibrations applied to said rear end face;

converter means fixed to said rear end face of said horn body at a position substantially medial of the length of said rear end face for applying said vibrations to said horn body in response to electrical energy supplied to said converter means; and a pair of elongate resonating members, each fixed at one end to a different side end region of said rear end face and extending normally from said rear end face, for causing said acoustic waves to propagate from said front end face at substantially uniform amplitude along the length of said front end face;

wherein objects moving along the direction of said front end face at a certain distance therefrom are continuously subjected to substantially uniform acoustic waves.

2. A horn assembly according to claim 1, wherein each of said elongate resonating members is of an acoustic length which is one-half the wavelength of the acoustic waves to be transmitted by said horn body.

3. A horn assembly according to claim 1, wherein said converter means is of generally cylindrical shape and is fixed at one axial end face to said rear end surface of said horn body to extend normally from said rear end face.

4. A horn assembly according to claim 3, wherein said converter means is of acoustic length which is one-half the wave length of the acoustic waves to be transmitted by said horn body.

5. An ultrasonic horn asembly according to claim 1 wherein said horn body is comprised of heat-treated titanium.

6. A horn assembly according to claim 1, wherein said horn body is dimensioned so that said front end face and said rear end face each coincide with an anti-nodal plane when acoustic waves are transmitted by said horn body.

7. A horn assembly according to claim 3, wherin said converter means comprises a cylindrical back section, a cylindrical front section one axial end face of which is arranged to abut the rear end face of said horn body, cylindrical crystal means one axial end face of which abuts the opposite axial end face of said front section and the opposite axial end face of which abuts an axial face of said back section, for producing vibrations at the axial end face of said crystal means which abuts the rear end face of said horn body, said back section, said front section and said crystal means each having an axial bore to form an axial opening through said converter means, and elongate fastening means arranged to extend through said axial opening for clamping said back and said front sections against the end faces of said crystal means.

8. A horn assembly according to claim 7, wherein the acoustic impedance of said back section differs from that of said front section by a ratio of about 2.5 to 1.

9. A horn assembly according to claim 8, wherein said back section comprises stainless steel and said front section comprises aluminum.

10. A horn assembly according to claim 7, wherein said crystal means comprises two axially aligned cylindrical disks of piezoelectric material and metallic contact means interposed between confronting axial end faces of like polarity of said disks for applying an electrical potential to the confronting axial end faces of said disks.

11. A horn assembly according to claim 10, wherein said fastening means comprises a metallic screw member for electrically connecting said back section to said front section, so that the non-confronting axial end faces of said disks are at a common electrical potential.

12. A horn assembly according to claim 1, wherein said horn body comprises a generally rectangular rear body section having said rear end face, and a generally rectangular front body section having said front end face and being of a thickness less than that of said rear body section, said rear and said front body sections being integrally formed to define a thickness transition region substantially coincident with a nodal plane when said acoustic waves are transmitted by said horn body.

13. A horn assembly according to claim 12, wherein the ratio of the area of the rear end face on said rear body section to that of the front end face on said front body section is about three to one.

14. A horn assembly according to claim 2, wherein each of said resonating members is of a generally cylindrical shape and has a circumferential mounting groove on its outer periphery for seating a horn mounting member, said mounting groove being formed substantially coincident with a nodal plane when said acoustic waves are transmitted by said horn body.

15. A horn assembly according to claim 7, wherein said crystal means is located substantially coincident with a nodal plane when said acoustic waves are transmitted by said horn.

16. A horn assembly according to claim 1, wherein said horn body has a pair of elongate slot openings through the thickness of said horn body, each of said slot openings being located the same distance from and extending parallel to a different side of a horn body center line which is perpendicular to said front and said rear end faces, said slot openings being formed to attenuate undesired modes of vibration of said horn body.

* * * * *